United States Patent [19]
Kronlund

[11] Patent Number: 6,043,513
[45] Date of Patent: *Mar. 28, 2000

[54] METHOD OF PRODUCING AN OHMIC CONTACT AND A SEMICONDUCTOR DEVICE PROVIDED WITH SUCH OHMIC CONTACT

[75] Inventor: Bertil Kronlund, Stockholm, Sweden

[73] Assignee: Telefonaktiebolaget LM Ericsson, Stockholm, Sweden

[ * ] Notice: This patent issued on a continued prosecution application filed under 37 CFR 1.53(d), and is subject to the twenty year patent term provisions of 35 U.S.C. 154(a)(2).

[21] Appl. No.: 09/151,277

[22] Filed: Sep. 11, 1998

Related U.S. Application Data

[62] Division of application No. 08/875,038, Jul. 17, 1997.

[30] Foreign Application Priority Data

Jan. 18, 1995 [SE] Sweden .................................. 9500152
Jan. 17, 1996 [SE] Sweden .................... PCT/SE96/00035

[51] Int. Cl.[7] ........................ H01L 31/0312; H01L 29/74
[52] U.S. Cl. ........................... 257/77; 257/763; 257/298; 438/931; 438/602
[58] Field of Search ............................. 257/77, 763, 298, 257/734, 743, 744, 770, 771; 438/931, 602

[56] References Cited

U.S. PATENT DOCUMENTS

| 4,990,994 | 2/1991 | Furukawa et al. | 257/77 |
| 5,124,779 | 6/1992 | Furukawa et al. | 257/77 |
| 5,319,220 | 6/1994 | Suzuki et al. | 257/77 |
| 5,539,217 | 7/1996 | Edmond et al. | 257/77 |
| 5,561,829 | 10/1996 | Sawtell et al. | 419/13 |

OTHER PUBLICATIONS

H. Daimon et al., "Annealing Effects on Al and Al–Si Contacts with 3C–SiC,"Japanese Journal of Applied Physics, vol. 25, No.7 pp. L592–L594 (Jul. 1986).

G. Gao et al., "High Frequency Performance of SiC Heterojunction Bipolar Transistors,"IEEE Transactions on Electron Devices, vol. 41, No. 7, pp. 1092–1097 (Jul. 1994).

Primary Examiner—Wael Fahmy
Assistant Examiner—Hung Van Duong
Attorney, Agent, or Firm—Burns, Doane, Swecker & Mathis, LLP

[57] ABSTRACT

In a method of producing an ohmic contact (5) to a p-type α-SiC layer (3b) in a semiconductor device (1), layers of aluminium, titanium and silicon are deposited on said α-SiC layer (3b), and said deposited layers (5) are annealed to convert at least part of said deposited layers (5) to aluminium-titanium-silicide.

1 Claim, 1 Drawing Sheet

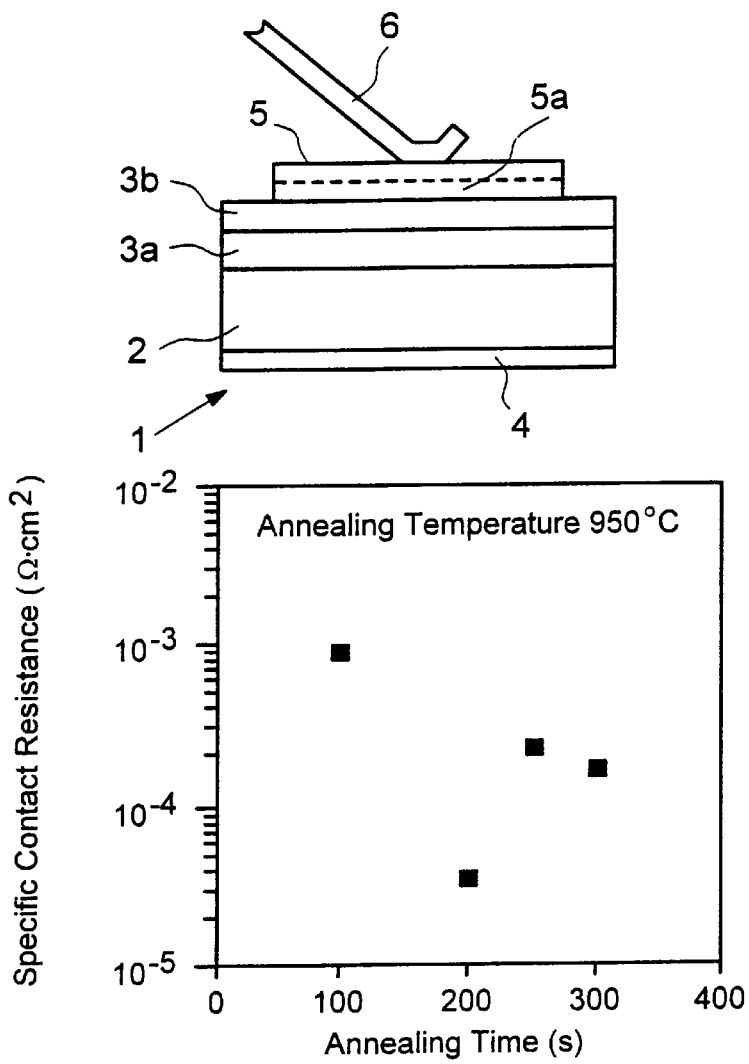
FIG. 1
FIG. 2
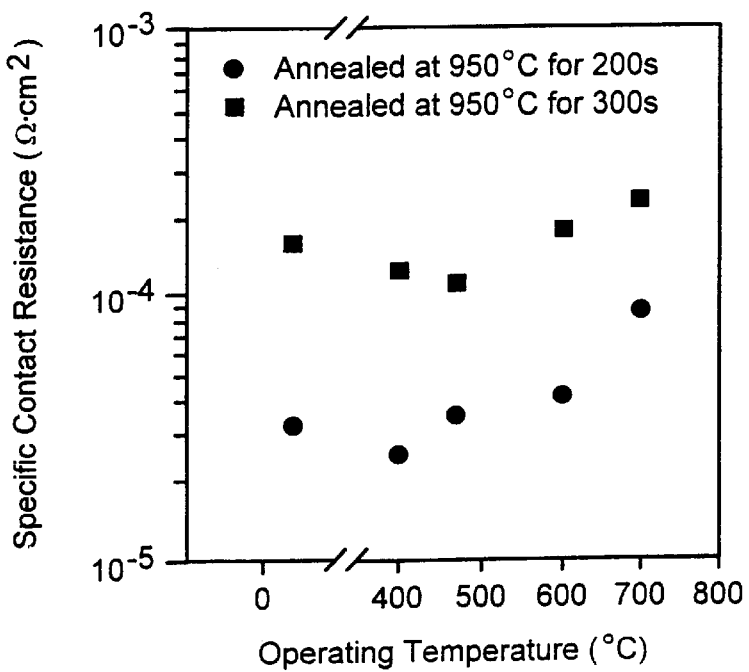
FIG. 3

METHOD OF PRODUCING AN OHMIC CONTACT AND A SEMICONDUCTOR DEVICE PROVIDED WITH SUCH OHMIC CONTACT

This application is a divisional of application Ser. No. 08/875,038, filed Jul. 17, 1997 now U.S. Pat. No. 5,877,077.

TECHNICAL FIELD

The invention relates to a method of producing an ohmic contact to a p-type α-SiC layer in a semiconductor device as well as to a semiconductor device provided with such ohmic contact.

BACKGROUND OF THE INVENTION

Crystalline silicon carbide exists in many chemically different forms such as the hexagonal crystal form α-SiC, particularly 6H-SiC, and the cubic crystal form β-SiC (3C-SiC).

SiC semiconductor devices are of great interest in view of the fact that the thermal conductivity is 330% higher in SiC than in Si and 10 times higher than in GaAs, that the breakdown electric field is 10 times higher in SiC than in both Si and GaAs, that the saturated electron drift velocity which is the speed limit for electrons in a material, is 40–50% higher in SiC than in both Si and GaAs, and that the wide bandgap in SiC enables operation at temperatures higher than 500° C.

Most semiconductor devices need terminal connections to carry electric current to and from the internal of the semiconductor device. Such a terminal connection, usually called an ohmic contact, must not however impair the semiconductor device itself. Thus, the voltage drop over the ohmic contact should be negligible compared to the voltage drop across other areas of the semiconductor device at the current density in question.

From the article "High Frequency Performance of SiC Heterojunction Bipolar Transistors", G. Guang-bo et al., IEEE Transaction on Electron Devices, Vol. 41, No. 7, Jul. 1994, pp. 1092, it is apparent that a specific contact resistance of less than 0.0001 Ω.cm² for p-type SiC, is required if silicon carbide devices are to have a future in comparison with Si and GaAs devices.

Aluminium has been considered a potential contact metal but its low melting point, 660° C., makes it less ideal at high power or high temperature operation. Another problem with aluminium is its reactivity with oxygen that may result in isolating oxides.

In "Annealing Effects on Al and Al-Si Contacts with 3C-SiC", H. Daimon et al., Japanese Journal of Applied Physics, Vol. 25, No. 7, Jul., 1986, pp.L592–L594, the Al-Si contact electrodes are described after heat treatment from 200° C. to 1000° C. The Al-Si contact was considered as an ohmic contact but the resulting electrode was found to be inhomogeneously granular with potential reliability problems.

Another attempt to obtain a high performance ohmic contact on 3C-SiC is described in U.S. Pat. No. 4,990,994 and U.S. Pat. No. 5,124,779 where silicon is replaced by titanium in combination with aluminum. Heat treatment is preferably avoided due to the above mentioned uniformity problems. A linear current-voltage characteristic for n-type 3C-SiC material is presented.

JP 4-85972 relates to a method of reducing contact resistance of a p-type α-silicon carbide with an electrode, and making the ohmic properties in the electrode uniform by laminating an Ni film, a Ti film in an arbitrary sequence on the SiC, laminating an Al film thereon, and then heat-treating it. The specific contact resistance is not sufficiently low for a high performance ohmic contact, and nothing is stated about the stability properties at elevated operating temperatures.

BROAD DESCRIPTION OF THE INVENTION

The object of the invention is to provide a method of producing a high performance ohmic contact to p-type α-SiC, i.e. an ohmic contact which has a low specific contact resistance which is thermally stable at high operating temperatures.

This object is attained by the method according to the invention by depositing layers of aluminium, titanium and silicon on said α-SiC layer, annealing said deposited layers to convert at least part of said deposited layers to aluminium-titanium-silicide.

BRIEF DESCRIPTION OF DRAWING

The invention will be described more in detail below with reference to the appended drawing on which FIG. 1 is a cross-sectional view of an embodiment of a semiconductor device provided with an ohmic contact according to the invention, FIG. 2 is a diagram of the specific contact resistance of an ohmic contact according to the invention, as a function of annealing time, and FIG. 3 is a diagram of the specific contact resistance of two ohmic contacts according to the invention, annealed for two different periods of time, as a function of operating temperature.

DETAILED DESCRIPTION OF THE INVENTION

As an example of a semiconductor device where an ohmic contact according to the invention can be applied, FIG. 1 shows an embodiment of a semiconductor junction diode, generally denoted 1.

The diode 1 comprises a substrate 2 of single crystalline α-SiC, which on its top side is provided with a n-type layer 3a of α-SiC. On top of said layer 3a, a p-type layer 3b of α-SiC is provided. The layer 3b has a carrier concentration of $1 \times 10^{18}$ cm$^{-3}$.

On top of the p-type α-SiC layer 3b, the diode 1 is provided with an ohmic contact 5 according to the invention.

According to the invention, the ohmic contact 5 comprises a metallization of aluminium-titanium-silicide.

This ohmic contact 5 is produced by depositing individual layers of aluminium, titanium and silicon, preferably having a combined thickness of less than 300 nm, on the p-type α-SiC layer 3b, which layers preferably are deposited in that order, and annealing or sintering the so deposited layers to convert at least part of these deposited layers to aluminium-titanium-silicide. The converted part is schematically denoted 5a, and is located towards the interface to the layer 3b. It should, however, be pointed out that there is no distinct border line between the converted and the non-converted parts of the ohmic contact 5.

The annealing or sintering of the deposited layers takes place at a temperature of at least 900° C., preferably 950° C., during a period of time of preferably 200 s.

FIG. 2 shows the specific contact resistance of the ohmic contact 5 as a function of the annealing or sintering time at an annealing or sintering temperature of 950° C.

The annealing or sintering process can be carried out in standard process equipment such as a rapid thermal annealer, and the metal layers can be deposited in a manner known per se by means of an electron-beam evaporator with an ion gun or a sputter deposition system. This type of equipement is to be found in any modern silicon or III-V production line.

The diode 1, moreover, comprises an ohmic contact 4 to the bottom side of the substrate 2, and a bondwire 6 to the ohmic contact 5. Also the ohmic contact 4 is produced in accordance with the method according to the invention.

The strong oxygen gettering effect of titanium which causes small amounts of oxygen residues to be captured which later oxidises the aluminium during the contact sintering, is; counteracted by the silicon layer which stimulates the silicide formation. During the tri-metal aluminium-titanium-silicide formation, i.e. the sintering or annealing phase, any bound oxygen is rejected from the SiC-metal interface.

The low specific contact resistance of the ohmic contact according to the invention, is attributed to the above effect as well as to the facts that aluminium is a p-type dopant in SiC and that the interface is moved into the SiC during the silicide formation. The resulting aluminium-titanium-silicide contact is, thus, thermally stable, although it contains aluminium.

FIG. 3 shows the temperature stability of the specific contact resistance at different operating temperatures of two different ohmic contacts according to the invention, annealed at the same temperature of 950° C., but annealed for 200 s and 300 s, respectively.

Thus, by the method according to the invention, an ohmic contact is obtained, which exhibits a very low specific contact resistance which is stable within a wide range of operating temperatures.

I claim:

1. A semiconductor device comprising a p-type α-SiC layer, characterized in that at least one ohmic contact comprising aluminium-titanium-silicide, is provided on said α-SiC layer.

* * * * *